US012757662B2

(12) United States Patent
Tsujimoto

(10) Patent No.: US 12,757,662 B2
(45) Date of Patent: Oct. 6, 2026

(54) WAFER PROCESSING METHOD

(71) Applicant: DISCO CORPORATION, Tokyo (JP)

(72) Inventor: Kohei Tsujimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 582 days.

(21) Appl. No.: 18/493,111

(22) Filed: Oct. 24, 2023

(65) Prior Publication Data

US 2024/0153777 A1 May 9, 2024

(30) Foreign Application Priority Data

Nov. 4, 2022 (JP) ................................ 2022-177157

(51) Int. Cl.
*H10P 52/00* (2026.01)
*H10P 58/00* (2026.01)
*H10P 72/76* (2026.01)

(52) U.S. Cl.
CPC .............. *H10P 52/00* (2026.01); *H10P 58/00* (2026.01); *H10P 72/7606* (2026.01)

(58) Field of Classification Search
CPC ...... H10P 52/00; H10P 58/00; H10P 72/7606; H10P 72/7416; H10P 72/0442; H10P 72/7402; H10P 72/0428; H10P 72/7418; H10P 72/742; H10P 54/00; H10P 54/40
See application file for complete search history.

(56) References Cited

U.S. PATENT DOCUMENTS

2023/0253233 A1* 8/2023 Nunotani ................ H10P 52/00 257/620

FOREIGN PATENT DOCUMENTS

| | | |
|---|---|---|
| JP | 2007019461 A | 1/2007 |
| JP | 2008042081 A | 2/2008 |
| JP | 2013098248 A | 5/2013 |

* cited by examiner

*Primary Examiner* — Matthew C Landau
*Assistant Examiner* — Halee Cramer
(74) *Attorney, Agent, or Firm* — GREER BURNS & CRAIN, LTD.

(57) ABSTRACT

A wafer processing method includes a first fixing step of making a first resin sheet conform to a circular recessed portion and a ring-shaped reinforcing portion of a wafer by fixing an undersurface of the wafer to the first resin sheet, after the first fixing step, a second fixing step of forming a cavity between the first resin sheet fixed to the circular recessed portion and a second resin sheet by fixing the second resin sheet to the first resin sheet fixed to the ring-shaped reinforcing portion, after the second fixing step, a holding step of holding the second resin sheet of the wafer on a chuck table, and a groove forming step of forming a separating groove for separating the circular recessed portion and the ring-shaped reinforcing portion from each other.

3 Claims, 7 Drawing Sheets

WAFER PROCESSING METHOD

BACKGROUND OF THE INVENTION

Field of the Invention

The present invention relates to a method of processing a wafer including a circular recessed portion in an undersurface of the wafer and a ring-shaped reinforcing portion formed on the periphery of the circular recessed portion.

Description of the Related Art

In a process of manufacturing semiconductor devices such as integrated circuits (ICs) or large-scale integration (LSI) circuits used in electronic apparatuses, a wafer is thinned to a predetermined thickness by grinding the undersurface of the wafer, in order to reduce the size and weight of the semiconductor devices. Particularly in recent years, there has been a desire to form thin semiconductor devices in order to meet demands such as reduction in thickness or size of electronic apparatuses such as mobile telephones and personal computers. However, when the grinding is performed until the thickness of the wafer becomes equal to or less than 50 μm, for example, the transverse rupture strength of the wafer is decreased, the wafer thus tends to be damaged easily, and subsequent handling of the wafer consequently becomes difficult.

Accordingly, Japanese Patent Laid-Open No. 2007-019461 and Japanese Patent Laid-Open No. 2008-042081, for example, propose grinding methods for enhancing the rigidity of the wafer that has undergone the grinding, by grinding only the underside of a region of the wafer in which region the devices are formed, thereby forming a circular recessed portion in a central portion of the wafer, and leaving a ring-shaped reinforcing portion having a same thickness as before the grinding, on a peripheral side of the circular recessed portion. Such a grinding method enables the ring-shaped reinforcing portion formed at the undersurface of the wafer to prevent damage at a time of handling the wafer, for example.

Meanwhile, when the wafer is divided into individual chips after the grinding, the ring-shaped reinforcing portion hinders the division. The ring-shaped reinforcing portion therefore needs to be removed in advance before the division. Accordingly, a protrusion-shaped chuck table corresponding to a level difference between the circular recessed portion of the wafer and the ring-shaped reinforcing portion on the periphery of the circular recessed portion is used to form a separating groove in a circular shape on the peripheral side of the wafer, and the ring-shaped reinforcing portion is detached and removed with the separating groove as a boundary. In this case, when the protrusion-shaped chuck table is used, both the circular recessed portion and the ring-shaped reinforcing portion of the wafer need to be supported with high accuracy in order to prevent the occurrence of chipping and cracking at a time of the formation of the separating groove. Accordingly, Japanese Patent Laid-Open No. 2013-098248 proposes a method of adjusting the level difference of a protrusion shape between the circular recessed portion and the ring-shaped reinforcing portion of the wafer by using annular spacers of different thicknesses according to the level difference between the circular recessed portion and the ring-shaped reinforcing portion of the wafer.

SUMMARY OF THE INVENTION

However, according to the method proposed in Japanese Patent Laid-Open No. 2013-098248, spacers need to be changed according to the level difference between the circular recessed portion and the ring-shaped reinforcing portion of the wafer from which the ring-shaped reinforcing portion is to be separated. Thus, a large amount of time and effort is required, resulting in poor work efficiency.

It is accordingly an object of the present invention to provide a wafer processing method that can form a separating groove for separating the circular recessed portion and the ring-shaped reinforcing portion of a wafer from each other efficiently in a short time and remove the ring-shaped reinforcing portion easily regardless of a level difference between the circular recessed portion and the ring-shaped reinforcing portion of the wafer.

In accordance with an aspect of the present invention, there is provided a wafer processing method of processing a wafer, the wafer including, on a top surface, a device region having a device formed in each of a plurality of regions demarcated by a plurality of planned dividing lines formed in a lattice manner and a peripheral surplus region surrounding the device region, and the wafer having a circular recessed portion on an undersurface side corresponding to the device region and including a ring-shaped reinforcing portion along an outer circumference of the circular recessed portion, the wafer processing method including a first fixing step of making a first resin sheet conform to the circular recessed portion and the ring-shaped reinforcing portion by fixing an undersurface of the wafer to the first resin sheet, after the first fixing step, a second fixing step of forming a cavity between the first resin sheet fixed to the circular recessed portion and a second resin sheet by fixing the second resin sheet to the first resin sheet fixed to the ring-shaped reinforcing portion, after the second fixing step, a holding step of holding the second resin sheet of the wafer by a chuck table, and a groove forming step of forming a separating groove for separating the circular recessed portion and the ring-shaped reinforcing portion from each other.

According to the present invention, the second fixing step fixes the second resin sheet to a part of the first resin sheet which part is fixed to the ring-shaped reinforcing portion, the first resin sheet being fixed in such a manner as to conform to the circular recessed portion in the undersurface of the wafer and the ring-shaped reinforcing portion in the first fixing step. The cavity is thereby formed between the first resin sheet corresponding to the circular recessed portion of the wafer and the second resin sheet. Therefore, when the chuck table is made to hold the second resin sheet surface of the wafer in the next holding step, a level difference between the circular recessed portion and the ring-shaped reinforcing portion of the wafer is accommodated by the cavity formed between the first resin sheet and the second resin sheet. Consequently, the protrusion-shaped chuck table becomes unnecessary, and a spacer corresponding to the level difference between the circular recessed portion and the ring-shaped reinforcing portion of the wafer also becomes unnecessary. It is thus possible to hold the wafer on the chuck table by a simple configuration.

Then, in the next groove forming step, the separating groove is formed in the top surface of the wafer held on the chuck table, so that the ring-shaped reinforcing portion can be separated and removed from the wafer with the separating groove as a boundary. Hence, the present invention provides an effect of being able to form the separating groove for separating the circular recessed portion and the ring-shaped reinforcing portion of the wafer from each other efficiently in a short time and remove the ring-shaped reinforcing portion easily regardless of the level difference between the circular recessed portion and the ring-shaped reinforcing portion.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
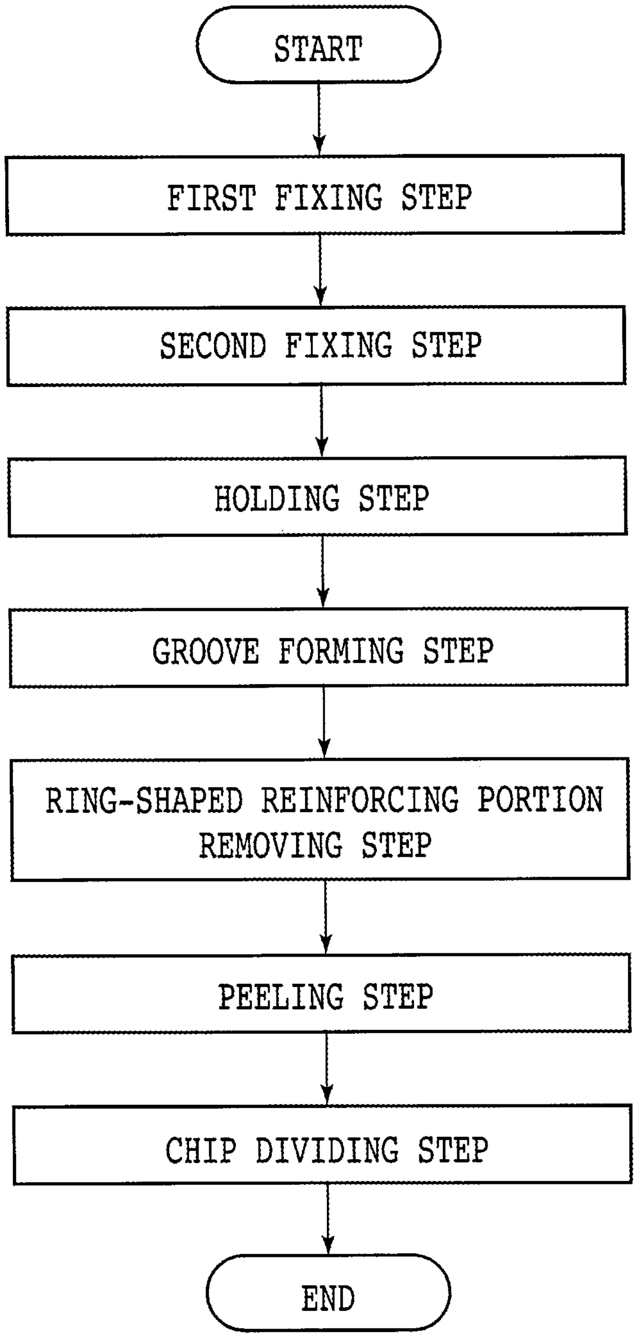
FIG. 1 is a flowchart depicting a method according to the present invention in order of steps thereof.
Figure 2A:
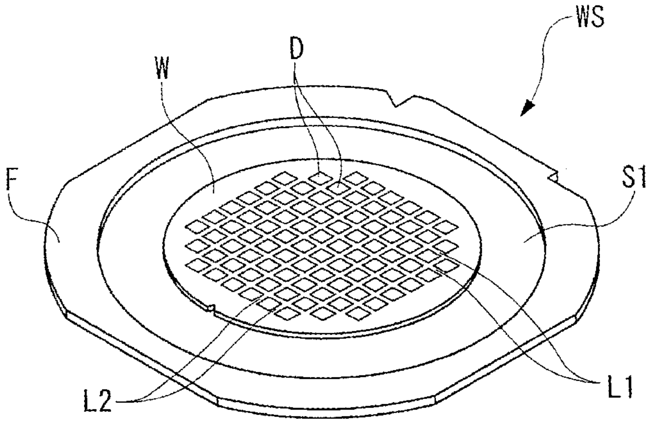
FIG. 2A is a perspective view of a frame unit.
Figure 2B:
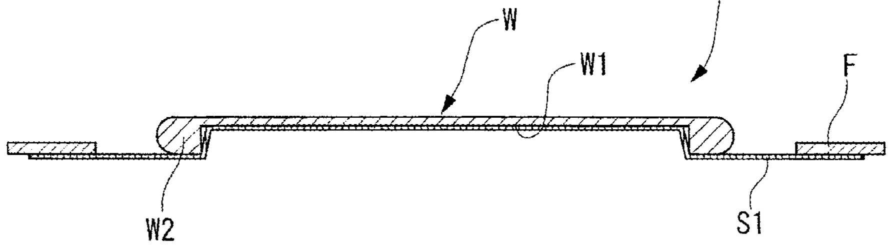
FIG. 2B is a vertical sectional view of the same frame unit.

An embodiment of the present invention will hereinafter be described with reference to the accompanying drawings. A wafer processing method according to the present invention is a method that removes a ring-shaped reinforcing portion W2 before dividing a wafer W into individual device chips, the wafer W having a circular recessed portion W1 formed in a central portion of an undersurface (lower surface in FIG. 2B) and having the ring-shaped reinforcing portion W2 formed on the periphery of the circular recessed portion W1, as depicted in FIG. 2B, and divides the wafer W from which the ring-shaped reinforcing portion W2 is removed into individual device chips, by cutting the wafer W. As depicted in FIG. 1, the wafer processing method is a method that sequentially performs (1) a first fixing step, (2) a second fixing step, (3) a holding step, (4) a groove forming step, (5) a ring-shaped reinforcing portion removing step, (6) a peeling step, and (7) a chip dividing step, and thereby finally divides the wafer W into individual device chips. In the following, each of the steps will be described.

(1) First Fixing Step:

The first fixing step is a step of fixing a first resin sheet S1 in a circular shape in such a manner as to conform to the circular recessed portion W1 formed in the undersurface (lower surface in FIG. 2B) of the wafer W and the ring-shaped reinforcing portion W2 on the periphery of the circular recessed portion W1, as depicted in FIG. 2B. Here, the wafer W in a thin disk shape is formed of a single crystal silicon base material. As depicted in FIG. 2A, the wafer W has a device region and a peripheral surplus region surrounding the device region in a top surface (upper surface in FIG. 2A) of the wafer W, the device region being demarcated into a large number of rectangular regions by a plurality of planned dividing lines L1 and L2 orthogonal to one another, the plurality of planned dividing lines L1 and L2 being referred to as streets arranged in a lattice manner.

In addition, in the wafer W, as depicted in FIG. 2B, the circular recessed portion W1 is formed at a central portion on an undersurface side corresponding to the device region, and the ring-shaped reinforcing portion W2 is formed along the circumference of the circular recessed portion W1. Here, as depicted in FIG. 2A, the plurality of rectangular regions demarcated by the planned dividing lines L1 and L2 of the wafer W each have a device D such as an IC or an LSI circuit formed therein. Then, a frame unit WS in which the wafer W and a ring frame F disposed on the periphery of the wafer W are integrated with each other by affixing the first resin sheet S1 to the wafer W and the ring frame F is formed. Incidentally, the first resin sheet S1 may be an adhesive tape having an adhesive layer formed therein, or may be a sheet of only a base material without the adhesive layer. Suitably used as the sheet of only a base material without the adhesive layer is one having a storage modulus of $10^6$ to $10^9$ (Pa) at a temperature of 10° C. to 30° C. and having a storage modulus of $10^6$ to $10^7$ (Pa) at a temperature of 80° C. to 100° C. at a time of heating (at a time of adhesion).

In a state in which the first resin sheet S1 is fixed in such a manner as to conform to the circular recessed portion W1 formed in the undersurface of the wafer W and the ring-shaped reinforcing portion W2 on the periphery of the circular recessed portion W1 in the first fixing step, the first resin sheet S1 is fixed to the circular recessed portion W1 and the ring-shaped reinforcing portion W2 of the wafer W, and also a peripheral end edge of the first resin sheet S1 is fixed to the lower surface of the ring frame F, as depicted in FIG. 2B.

Figure 3A:
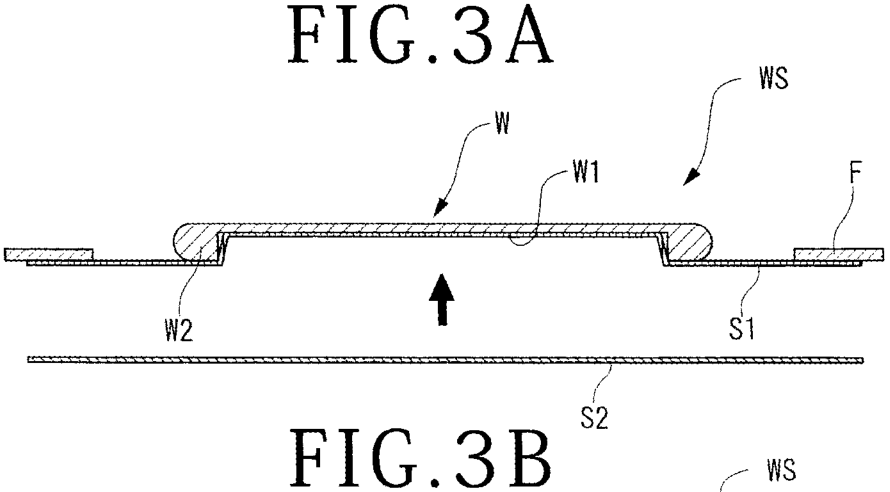
FIG. 3A is a vertical sectional view depicting a state before a second resin sheet is fixed to a first resin sheet.
Figure 3B:
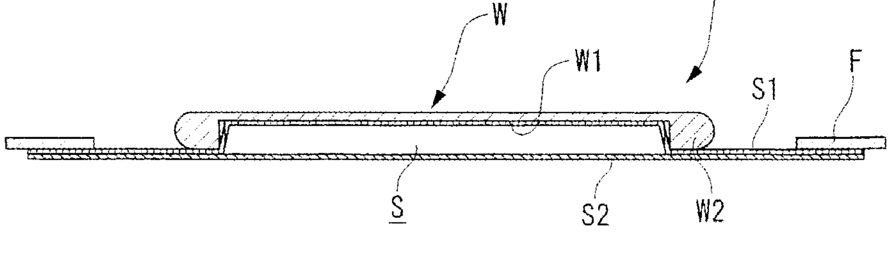
FIG. 3B is a vertical sectional view depicting a state in which the second resin sheet is fixed to the first resin sheet.

(2) Second Fixing Step:

The second fixing step is a step of fixing a second resin sheet S2 having a same circular shape as the first resin sheet S1 to the first resin sheet S1 fixed to the undersurface of the wafer W in the first step. Specifically, as depicted in FIG. 3A, the second resin sheet S2 is put to the first resin sheet S1 fixed to the undersurface of the wafer W, from the direction of an arrow depicted in FIG. 3A, and as depicted in FIG. 3B, the second resin sheet S2 is fixed to the lower surface of a part of the first resin sheet S1 (part that is on the ring-shaped reinforcing portion W2 of the wafer W and the ring frame F disposed on the peripheral side of the ring-shaped reinforcing portion W2 and that couples the ring-shaped reinforcing portion W2 and the ring frame F to each other) excluding a part of the first resin sheet S1 which part is fixed to the circular recessed portion W1 of the wafer W. As a result, a cavity S filled with air is formed between the first resin sheet S1 and the second resin sheet S2, specifically, between a part of the first resin sheet S1 which part is fixed to the circular recessed portion W1 of the wafer W and a central part of the second resin sheet S2 which central part corresponds to the part of the first resin sheet S1. Incidentally, as with the first resin sheet S1, the second resin sheet S2 may be an adhesive tape having an adhesive layer formed therein, or may be a sheet of only a base material without the adhesive layer. Here, suitably used as the sheet of only a base material without the adhesive layer is one having a storage modulus of $10^6$ to $10^9$ (Pa) at a temperature of 10° C. to 30° C. and having a storage modulus of $10^6$ to $10^7$ (Pa) at a temperature of 80° C. to 100° C. at a time of heating (at a time of adhesion), as with the one used as the first resin sheet S1.

Figure 4A:
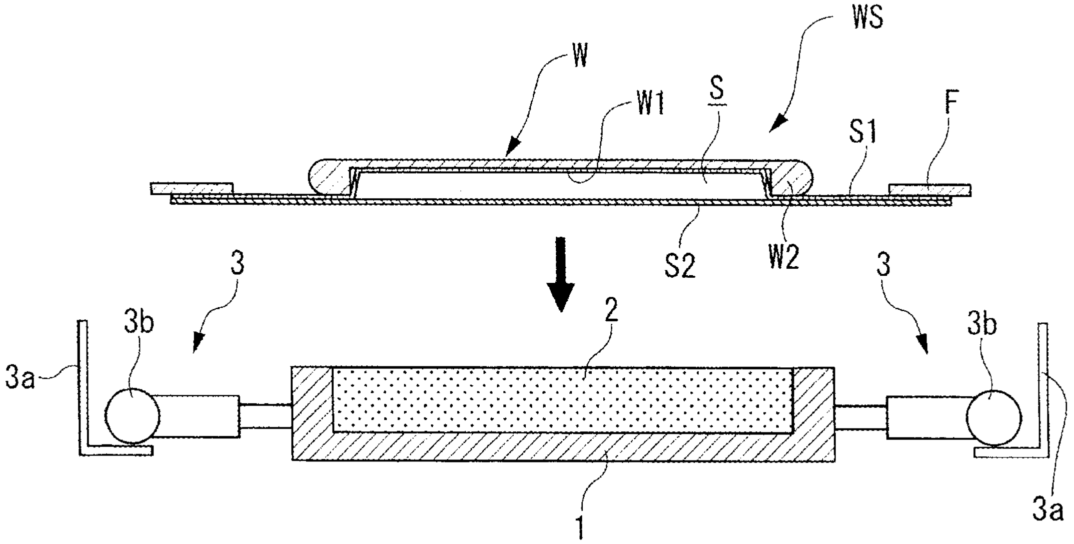
FIG. 4A is a vertical sectional view depicting a state before the frame unit is held on a chuck table.

(3) Holding Step:

The holding step is a step of holding the frame unit WS on a holding surface of a chuck table 1, the frame unit WS including the wafer W having the cavity S formed between the first resin sheet S1 and the second resin sheet S2 in the second fixing step. In the holding step, as depicted in FIG. 4A, in a state in which the second resin sheet S2 is on a lower side, the frame unit WS is lowered in the direction of an arrow depicted in FIG. 4A from above the chuck table 1, and is mounted on the holding surface of the chuck table 1. Here, the chuck table 1 is a disk-shaped member. A disk-shaped porous member 2 formed of a porous ceramic or the like is incorporated in a central portion of an upper portion of the chuck table 1. The upper surface of the disk-shaped porous member 2 constitutes the holding surface. Incidentally, the porous member 2 is selectively connected to an undepicted suction source such as a vacuum pump. In addition, the chuck table 1 can be rotated about a vertical axial center by an undepicted rotating mechanism.

Figure 4B:
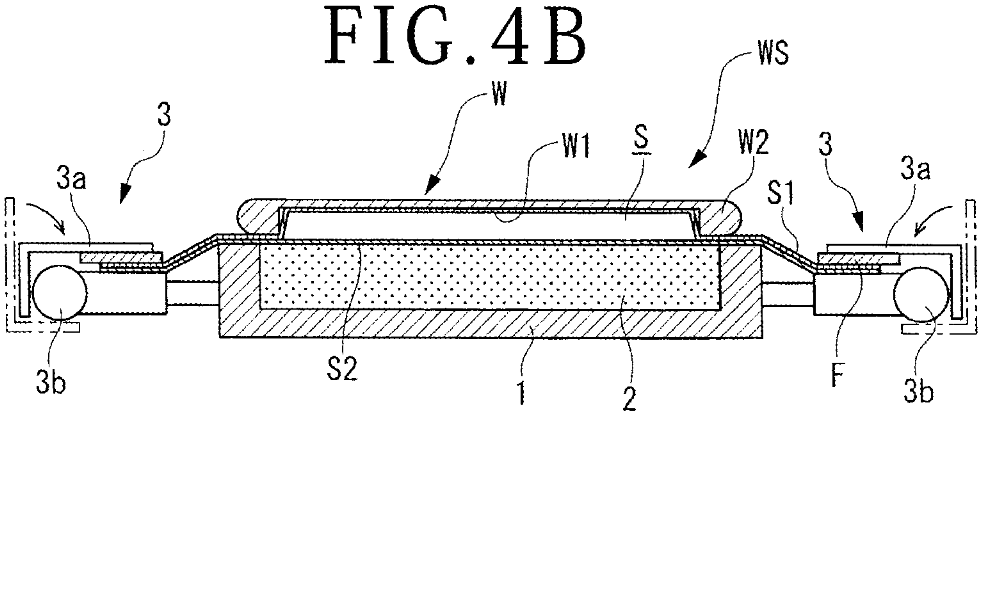
FIG. 4B is a vertical sectional view depicting a state in which the frame unit is held on the chuck table.

In addition, the periphery of the chuck table 1 is provided with four clamps 3 (only two clamps 3 are depicted in FIGS. 4A and 4B) at an equiangular pitch (90° pitch) in a circumferential direction. A holding member 3*a* that is bent in an L-shape is provided to each of the clamps 3 in such a manner as to be rotatable about an axis 3*b* in the direction of an arrow in FIG. 4B. Incidentally, in a state before the frame unit WS is fixed to the chuck table 1, the holding member 3*a* of each of the clamps 3 is in an opened state, as depicted in FIG. 4A.

Then, when the frame unit WS has been mounted on the holding surface of the chuck table 1 with the second resin sheet S2 on a lower side, the holding member 3*a* of each of the clamps 3 is rotated in the direction of the arrow to fix the ring frame F of the frame unit WS onto the chuck table 1 together with the first resin sheet S1 and the second resin sheet S2, as depicted in FIG. 4B. In addition, when the porous member 2 is vacuumed by the undepicted suction source, a negative pressure occurs in the porous member 2. The second resin sheet S2 is pulled by the negative pressure, and is thereby sucked and adheres onto the holding surface as the upper surface of the porous member 2. Consequently, the frame unit WS is securely held on the holding surface of the chuck table 1.

Thus, in the present embodiment, the second fixing step fixes the second resin sheet S2 to a part of the first resin sheet S1 which part is fixed to the ring-shaped reinforcing portion W2, the first resin sheet S1 being fixed in such a manner as to conform to the circular recessed portion W1 in the undersurface of the wafer W and the ring-shaped reinforcing portion W2 in the first fixing step. The cavity S is thereby formed between the first resin sheet S1 corresponding to the circular recessed portion W1 of the wafer W and the second resin sheet S2. Therefore, when the chuck table 1 is made to hold the second resin sheet S2 of the wafer W in the next holding step, as described earlier, a level difference between the circular recessed portion W1 and the ring-shaped reinforcing portion W2 of the wafer W is accommodated by the cavity S formed between the first resin sheet S1 and the second resin sheet S2. Consequently, the conventionally used protrusion-shaped chuck table becomes unnecessary, and a spacer corresponding to the level difference between the circular recessed portion W1 and the ring-shaped reinforcing portion W2 of the wafer W also becomes unnecessary. It is thus possible to hold the wafer W on the chuck table 1 by a simple configuration.

Figure 5A:
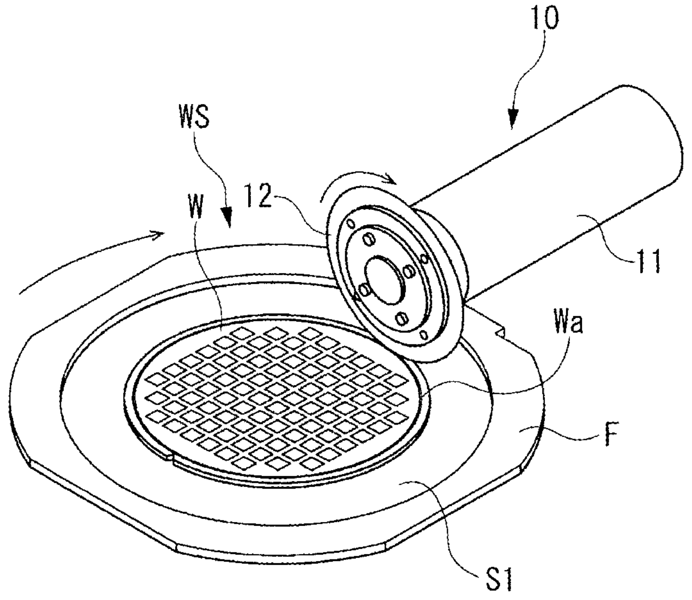
FIG. 5A is a perspective view of a cutting unit and the frame unit.
Figure 5B:
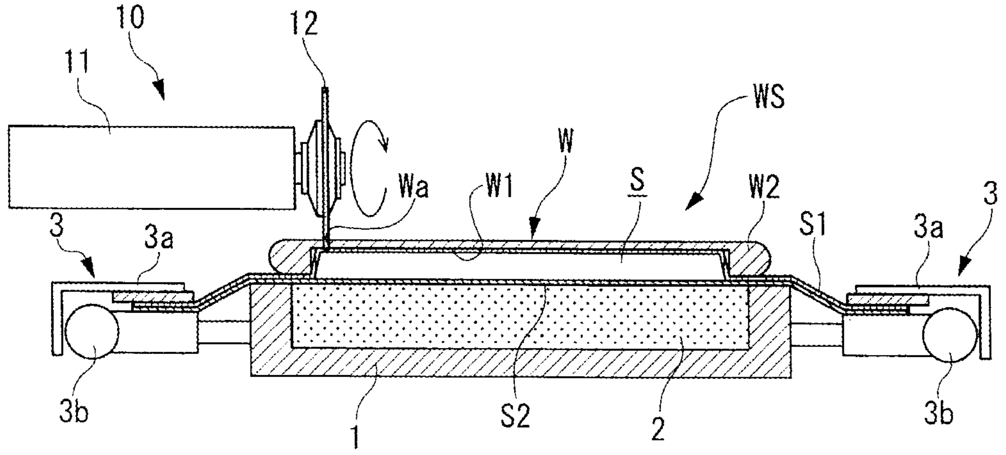
FIG. 5B is a vertical sectional view depicting groove processing, by the cutting unit, of a wafer held on the chuck table.

(4) Groove Forming Step:

The groove forming step is a step of forming a circular separating groove Wa (see FIG. 5A) that separates the circular recessed portion W1 and the ring-shaped reinforcing portion W2 of the wafer W from each other, the wafer W being held on the holding surface of the chuck table 1 together with the frame unit WS in the holding step. In the groove forming step, as depicted in FIG. 5A, a cutting blade 12 is rotated in the direction of an arrow depicted in FIG. 5A, by a spindle motor 11 of a cutting unit 10, and the chuck table 1 and the frame unit WS held by the chuck table 1 are rotated in the direction of an arrow in FIG. 5A by an undepicted rotary shaft. As depicted in FIG. 5B, a part of the top surface (upper surface in FIG. 5B) of the wafer W which part corresponds to a boundary between the circular recessed portion W1 and the ring-shaped reinforcing portion W2 is cut by the cutting blade 12. As depicted in FIG. 5A, the separating groove Wa is thereby formed in a circular shape in a peripheral portion of the top surface of the wafer W (part corresponding to the boundary between the circular recessed portion W1 and the ring-shaped reinforcing portion W2).

(5) Ring-Shaped Reinforcing Portion Removing Step:

The ring-shaped reinforcing portion removing step is a step of separating and removing the ring-shaped reinforcing portion W2 of the wafer W from the circular recessed portion W1 and the first resin sheet S1 with the separating groove Wa (see FIG. 5A) as a boundary, the separating groove Wa being formed in the top surface of the wafer W in the groove forming step. Specifically, a removing unit 20 depicted in FIG. 6B and FIG. 6C is used in the ring-shaped reinforcing portion removing step. The removing unit 20 is provided with removing tools 23 respectively fixed to shafts 22 hanging from three positions in a circumferential direction of a horizontal plate 21 that can be rotated and raised or lowered. Here, the shafts 22 and a total of three removing tools 23 (only two removing tools 23 are depicted in FIG. 6B and FIG. 6C) fixed to lower ends of the shafts 22 are provided at an equiangular pitch (120° pitch) in the circumferential direction. Each of the removing tools 23 is formed by connecting two upper and lower disks 23*a* and 23*b* in parallel with each other and at an interval wider than the thickness of the ring-shaped reinforcing portion W2 of the wafer W.

Figure 6A:
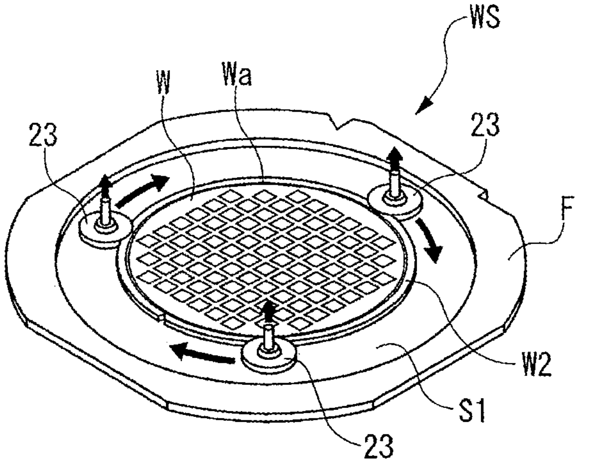
FIG. 6A is a perspective view depicting a state in which a ring-shaped reinforcing portion is being removed.
Figure 6B:
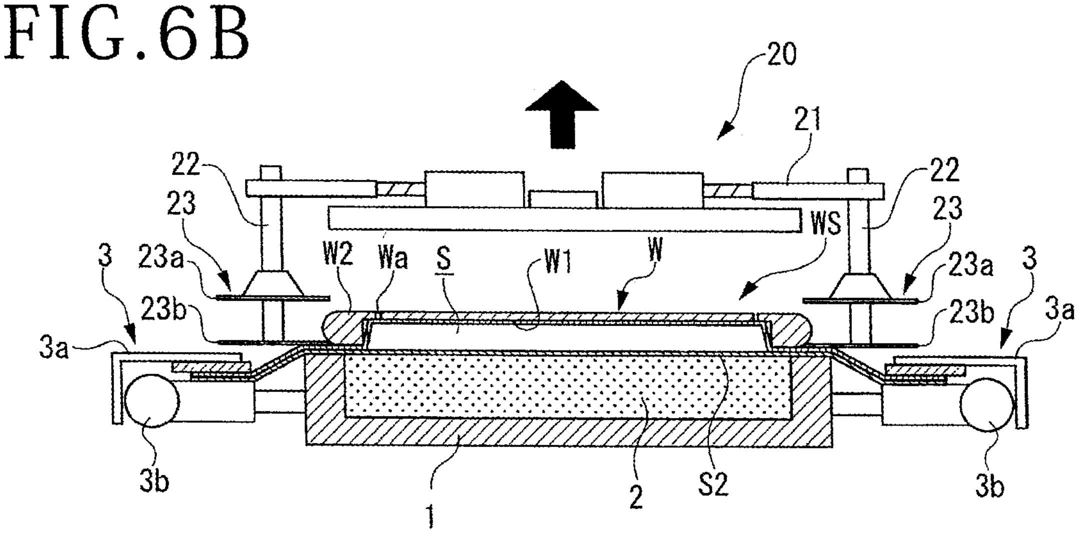
FIG. 6B is a vertical sectional view of the state depicted in FIG. 6A.
Figure 6C:
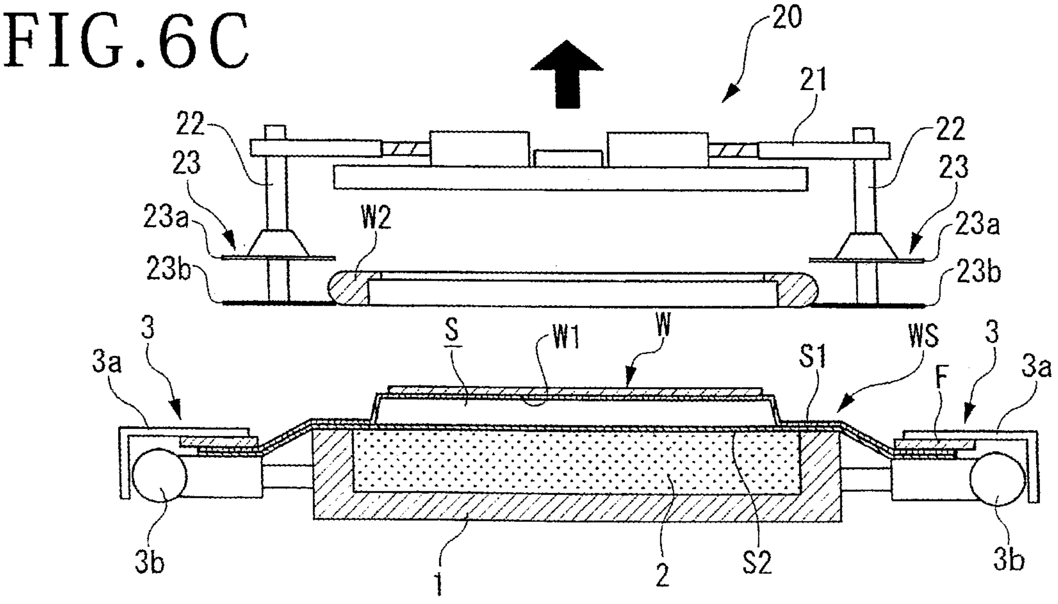
FIG. 6C is a vertical sectional view depicting a state after the removal of the ring-shaped reinforcing portion.

Thus, in order to remove the ring-shaped reinforcing portion W2 from the wafer W held on the chuck table 1 together with the frame unit WS, a peripheral portion of the lower disk 23*b* of each of the removing tools 23 is inserted into a gap between the ring-shaped reinforcing portion W2 of the wafer W and the first resin sheet S1, as depicted in FIG. 6B, and the removing tools 23 are lifted upward while rotated in the direction of arrows in FIG. 6A. Then, as depicted in FIG. 6C, the ring-shaped reinforcing portion W2 of the wafer W is lifted by the three removing tools 23 (only two removing tools 23 are depicted in FIG. 6C), the ring-shaped reinforcing portion W2 is detached from the circular recessed portion W1 and the first resin sheet S1 with the separating groove Wa as a boundary, and only a thin part remains in the wafer W.

Figure 7A:
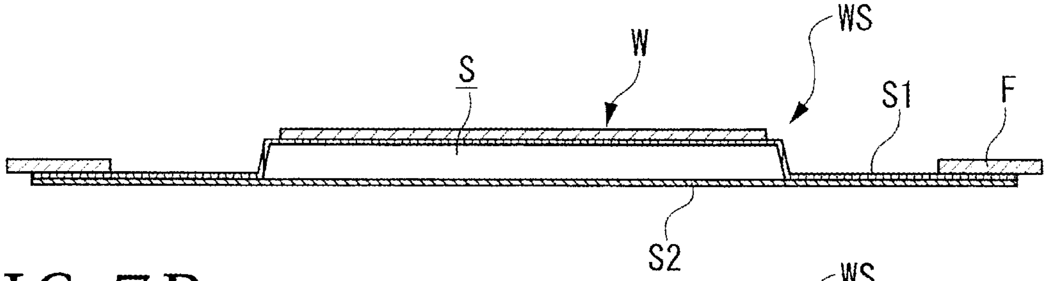
FIG. 7A is a vertical sectional view depicting a state before the second resin sheet is peeled off.
Figure 7B:
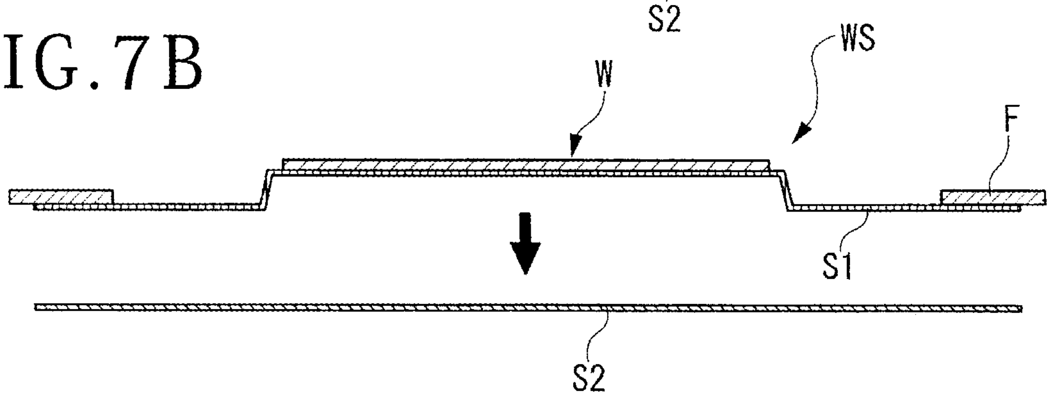
FIG. 7B is a vertical sectional view depicting a state after the second resin sheet is peeled off.

(6) Peeling Step:

The peeling step is a step of peeling the second resin sheet S2 from the first resin sheet S1 fixed to the thin wafer W from which the ring-shaped reinforcing portion W2 is removed in the ring-shaped reinforcing portion removing step. Specifically, in the peeling step, the second resin sheet S2 is peeled from the first resin sheet S1 by pulling the second resin sheet S2 in the direction of an arrow as depicted in FIG. 7B (downward) with respect to the wafer (thin wafer from which the ring-shaped reinforcing portion W2 is removed) W of the frame unit WS removed from the chuck table 1 and the first resin sheet S1 fixed to the ring frame F as depicted in FIG. 7A. Then, only the thin wafer W from which the ring-shaped reinforcing portion W2 is removed, the ring frame F, and the first resin sheet S1 remain in the frame unit WS.

(7) Chip Dividing Step:

The chip dividing step is a step of forming dividing grooves (not depicted) in a lattice shape by cutting the top surface of the thin wafer W from which the ring-shaped reinforcing portion W2 is removed, along the planned dividing lines L1 and L2 in a lattice shape, and dividing the wafer W into individual device chips by dividing the wafer W along the dividing grooves.

Figure 8A:
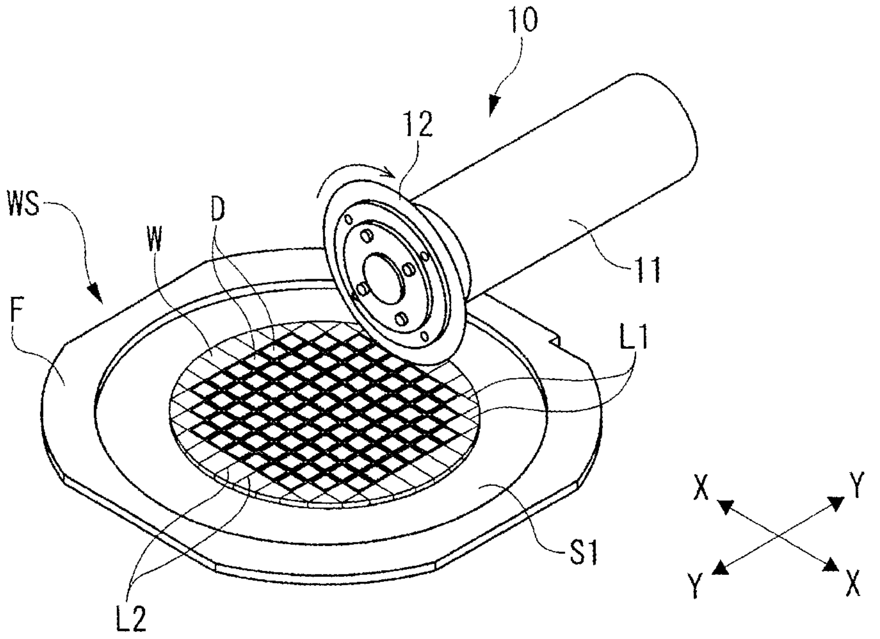
FIG. 8A is a perspective view of the cutting unit and the frame unit.
Figure 8B:
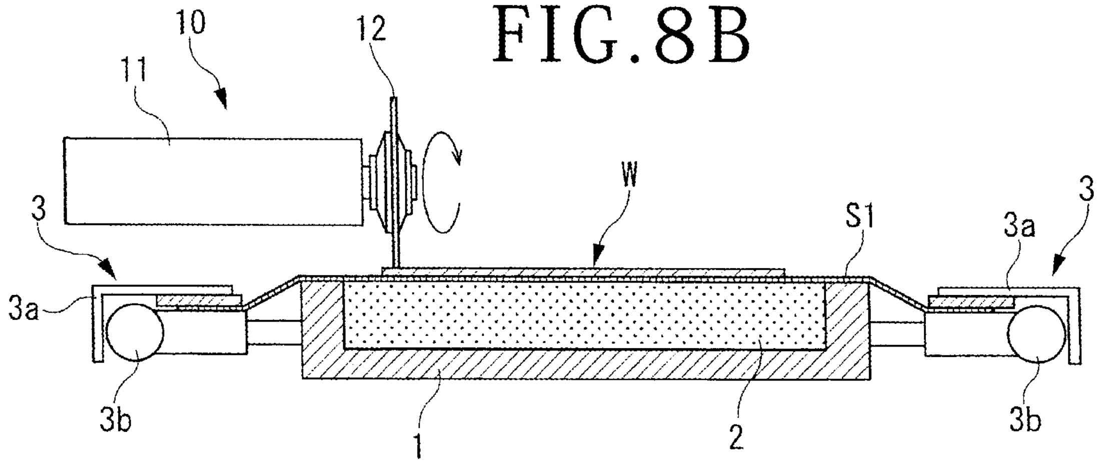
FIG. 8B is a vertical sectional view depicting cutting processing of the wafer.

Specifically, in the dividing step, as depicted in FIG. 8B, the frame unit WS from which the second resin sheet S2 is peeled in the peeling step is held on the holding surface of the chuck table 1 as in the holding step. While the cutting blade 12 is rotated in the direction of an arrow by the spindle motor 11 of the cutting unit 10, the top surface of the wafer W is cut along, for example, one planned dividing line L1 by moving the chuck table 1 and the frame unit WS held by the chuck table 1, in an X-axis direction (cutout direction).

More specifically, when an image is obtained by imaging the top surface of the wafer W by an undepicted imaging unit, the planned dividing line L1 to be cut is detected by pattern matching processing based on the image, the position in a Y-axis direction (indexing direction) of the cutting blade 12 is indexed, and the position in the Y-axis direction of the cutting blade 12 is adjusted to the position of the planned dividing line L1 to be cut.

Then, the cutting blade 12 of the cutting unit 10 is lowered by a predetermined cutting amount from the above-described state while rotationally driven at a high speed, and the chuck table 1 and the frame unit WS (wafer W) held by the chuck table 1 are moved in the X-axis direction. Then, the wafer W is cut along the planned dividing line L1 by the cutting blade 12, so that a dividing groove along the planned dividing line L1 is formed. Then, after such work is performed for all of the planned dividing lines L1 in one direction, the chuck table 1 and the frame unit WS held by the chuck table 1 are rotated by 90° by the undepicted rotating mechanism. The wafer W is similarly cut along a planned dividing line L2 in another direction orthogonal to the planned dividing lines L1 in which the cutting is completed, so that a dividing groove along the planned dividing line L2 is formed in the wafer W. Then, when the cutting of the wafer W along all of the planned dividing lines L1 and L2 is ended and the wafer W is divided along the dividing grooves by, for example, pulling and expanding the wafer W, a plurality of device chips mounted with individual devices D (see FIG. 1) are obtained.

According to the processing method in accordance with the present embodiment for obtaining the plurality of device chips from the wafer W by performing the series of steps described above, the second fixing step fixes the second resin sheet S2 to a part of the first resin sheet S1 which part is fixed to the ring-shaped reinforcing portion W2, the first resin sheet S1 being fixed in such a manner as to conform to the circular recessed portion W1 in the undersurface of the wafer W and the ring-shaped reinforcing portion W2 in the first fixing step. The cavity S is thereby formed between the first resin sheet S1 corresponding to the circular recessed portion W1 of the wafer W and the second resin sheet S2. Therefore, when the chuck table 1 is made to hold the second resin sheet S2 surface of the wafer W in the next holding step, a level difference between the circular recessed portion W1 and the ring-shaped reinforcing portion W2 of the wafer W is accommodated by the cavity S formed between the first resin sheet S1 and the second resin sheet S2. Consequently, the protrusion-shaped chuck table becomes unnecessary, and a spacer corresponding to the level difference between the circular recessed portion W1 and the ring-shaped reinforcing portion W2 of the wafer W also becomes unnecessary. It is thus possible to hold the wafer W on the chuck table 1 by a simple configuration.

Then, in the next groove forming step, the separating groove Wa is formed in the top surface of the wafer W held on the chuck table 1, so that the ring-shaped reinforcing portion W2 can be separated and removed from the wafer W with the separating groove Wa as a boundary. Hence, the method in accordance with the present invention provides an effect of being able to form the separating groove Wa for separating the circular recessed portion W1 and the ring-shaped reinforcing portion W2 of the wafer W efficiently in a short time and remove the ring-shaped reinforcing portion W2 easily regardless of the level difference between the circular recessed portion W1 and the ring-shaped reinforcing portion W2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer, the wafer including, on a top surface, a device region having a device formed in each of a plurality of regions demarcated by a plurality of planned dividing lines formed in a lattice manner and a peripheral surplus region surrounding the device region, and the wafer having a circular recessed portion on an undersurface side corresponding to the device region and including a ring-shaped reinforcing portion along an outer circumference of the circular recessed portion, the wafer processing method comprising:

a first fixing step of making a first resin sheet conform to the circular recessed portion and the ring-shaped reinforcing portion by fixing an undersurface of the wafer to the first resin sheet;

after the first fixing step, a second fixing step of forming a cavity between the first resin sheet fixed to the circular recessed portion and a second resin sheet by fixing the second resin sheet to the first resin sheet fixed to the ring-shaped reinforcing portion;

after the second fixing step, a holding step of holding the second resin sheet of the wafer by a chuck table; and a groove forming step of forming a separating groove for separating the circular recessed portion and the ring-shaped reinforcing portion from each other.

2. The wafer processing method according to claim 1, further comprising:

after the groove forming step,

- a ring-shaped reinforcing portion removing step of removing the ring-shaped reinforcing portion from the first resin sheet; and
- a peeling step of peeling the second resin sheet from the first resin sheet.

3. The wafer processing method according to claim 2, further comprising:

- after the peeling step, a chip dividing step of forming separating grooves along the planned dividing lines and dividing the wafer into individual device chips.

* * * * *